United States Patent [19]

Mori

[11] Patent Number: 4,952,806

[45] Date of Patent: Aug. 28, 1990

[54] NOISE ERASING METHOD FOR STIMULABLE PHOSPHOR SHEETS

[75] Inventor: Nobufumi Mori, Kanagawa, Japan

[73] Assignee: Fuji Photo Film Co., Ltd., Kanagawa, Japan

[21] Appl. No.: 402,599

[22] Filed: Sep. 5, 1989

[30] Foreign Application Priority Data

Sep. 6, 1988 [JP] Japan ................................ 63-223322

[51] Int. Cl.$^5$ ............................................ G01N 23/04
[52] U.S. Cl. .................................................. 250/327.2
[58] Field of Search .................. 250/327.2 C, 327.2 H

[56] References Cited

U.S. PATENT DOCUMENTS

| | | | |
|---|---|---|---|
| 4,258,264 | 3/1981 | Kotera et al. | 250/327.2 |
| 4,400,619 | 8/1983 | Kotera et al. | 250/327.2 |
| 4,584,482 | 4/1986 | Suzuki et al. | 250/327.2 |
| 4,651,220 | 3/1987 | Hosoi et al. | 250/327.2 |
| 4,687,937 | 8/1987 | Aagano et al. | 250/327.2 |
| 4,889,990 | 12/1989 | Hosoi et al. | 250/327.2 C |

FOREIGN PATENT DOCUMENTS 56-11395  2/1981  Japan .

Primary Examiner—Carolyn E. Fields
Attorney, Agent, or Firm—Sughrue, Mion, Zinn, Macpeak & Seas

[57] ABSTRACT

After a stimulable phosphor sheet having a radiation image stored thereon is exposed to stimulating rays causing the stimulable phosphor sheet to emit light in proportion to the amount of energy stored thereon during exposure to radiation, and the emitted light is detected to obtain an image signal representing the radiation image, the stimulable phosphor sheet is exposed to erasing light in order to release the energy remaining thereon. When the levels of components of the image signal, the components corresponding to part of the stimulable phosphor sheet, exceed a range of signal levels from which information about a radiation image can be detected accurately, the levels of energy stored at the part of the stimulable phosphor sheet are predicted from how the levels of the other components of the image signal, the levels falling within the range of signal levels, are distributed. The amount of erasing light is determined based on the predicted levels of energy.

4 Claims, 3 Drawing Sheets

NOISE ERASING METHOD FOR STIMULABLE PHOSPHOR SHEETS

BACKGROUND OF THE INVENTION

1. Field of the Invention

This invention relates to a noise erasing method for a stimulable phosphor sheet wherein, after a stimulable phosphor sheet which has a radiation image stored thereon is exposed to stimulating rays causing the stimulable phosphor sheet to emit light, the amount of light being proportional to the amount of energy stored thereon during exposure to radiation, in order to read out the radiation image, the stimulable phosphor sheet is exposed to erasing light thus releasing the energy remaining thereon.

2. Description of the Prior Art

When certain kinds of phosphors are exposed to radiation such as X-rays, $\alpha$-rays, $\beta$-rays, $\gamma$-rays, cathode rays or ultraviolet rays, they store part of the energy of the radiation. Then, when the phosphor which has been exposed to the radiation is exposed to stimulating rays such as visible light, light is emitted by the phosphor in proportion to the amount of energy stored during exposure to the radiation. A phosphor exhibiting such properties is referred to as a stimulable phosphor.

As disclosed in U.S. Pat. No. 4,258,264 and Japanese Unexamined Patent Publication No. 56(1981)-11395, it has been proposed to use stimulable phosphors in radiation image recording and reproducing systems. Specifically, a sheet provided with a layer of the stimulable phosphor (hereinafter referred to as a stimulable phosphor sheet) is first exposed to radiation which has passed through an object such as the human body in order to store a radiation image of the object thereon, and is then scanned with stimulating rays, such as a laser beam, which cause it to emit light in proportion to the amount of energy stored during exposure to the radiation. The light emitted by the stimulable phosphor sheet upon stimulation thereof is photoelectrically detected and converted into an electric image signal, and the image signal is used to reproduce the radiation image of the object as a visible image on a recording material such as photographic film, a display device such as a cathode ray tube (CRT), or the like.

The applicant proposed in U.S. Pat. No. 4,651,220 and U.S. patent application Ser. No. 251,982 reveal systems for recording and reproducing an electron microscope image wherein a stimulable phosphor sheet is utilized to record and reproduce an electron microscope image with a high sensitivity and with good image quality, and wherein an electric signal which represents the electron microscope image is directly obtained so that various kinds of processing operations are facilitated. Basically, the proposed methods of recording and reproducing an electron microscope image wherein a stimulable phosphor sheet is utilized comprise the steps of (i) exposing a stimulable phosphor sheet to an electron beam which has passed through a sample in a vacuum in order to store the energy of the electron beam on the stimulable phosphor sheet, (ii) thereafter exposing the stimulable phosphor sheet to stimulating rays in order to release the stored energy in the form of emitted light, (iii) photoelectrically detecting the emitted light to obtain an image signal, and (iv) using the image signal to reproduce an electron beam image of the sample.

In the aforesaid systems for recording and reproducing a radiation image or an electron microscope image (the radiation image and the electron microscope image are herein generically referred to as a radiation image), all energy stored on the stimulable phosphor sheet during exposure to radiation would be released if the stimulable phosphor sheet were exposed to stimulating rays having a substantially high intensity when the radiation image is read out from the stimulable phosphor sheet. Actually, however, the intensity of stimulating rays irradiated to the stimulable phosphor sheet is not very high, and part of the energy stored on the stimulable phosphor sheet during exposure to radiation remains unreleased after the radiation image is read out from the stimulable phosphor sheet. Therefore, in cases where the stimulable phosphor sheet is used repeatedly to record and reproduce radiation images, the energy remaining on the stimulable phosphor sheet causes noise and results in an image signal detected from the stimulable phosphor sheet. In order to release the energy remaining on the stimulable phosphor sheet, the stimulable phosphor sheet may be exposed to erasing light after the radiation image is read out from the stimulable phosphor sheet, as disclosed in, for example, U.S. Pat. No. 4,400,619. If the amount of the erasing light irradiated to the stimulable phosphor sheet were to be set to a very large value, good noise erasing effects would be obtained. However, for the sake of economy, the amount of the erasing light should not be set to an unnecessarily large value. Accordingly, methods have been proposed in, for example, U.S. Pat. Nos. 4,584,482 and 4,687,937, wherein the level of energy remaining on a stimulable phosphor sheet is detected from information detected from the stimulable phosphor sheet, and the amount of erasing light irradiated to the stimulable phosphor sheet is adjusted approximately at the minimum necessary value in accordance with the detected level of energy remaining on the stimulable phosphor sheet.

In cases where a radiation image of a human body is recorded on a stimulable phosphor sheet and is read out therefrom, a very high radiation dose is not applied to the stimulable phosphor sheet because radiation is harmful to the human body. However, in cases where an electron microscope image of a sample is recorded, a very large amount of electron beams are often irradiated to a stimulable phosphor sheet. In such cases, light having a markedly high intensity is emitted by the stimulable phosphor sheet when the stimulable phosphor sheet is exposed to stimulating rays in order to read out the electron microscope image from the stimulable phosphor sheet. The range over which image signals can be gathered is determined in advance with respect to the levels of image signals which are ordinarily obtained through photoelectric detection of light emitted by stimulable phosphor sheets. Therefore, in cases where an image signal has a markedly large value, the gathered signal value is clipped at the maximum value of the predetermined signal gathering range.

In such cases, the level of energy remaining on the stimulable phosphor sheet cannot be detected from information which has been read out from the stimulable phosphor sheet. Therefore, the amount of erasing light which is irradiated to the stimulable phosphor sheet cannot be set approximately to the minimum value necessary for the stimulable phosphor sheet.

SUMMARY OF THE INVENTION

The primary object of the present invention is to provide a noise erasing method for a stimulable phosphor sheet, wherein the amount of erasing light irradiated to a stimulable phosphor sheet is set to a suitable value, even when the level of energy stored on the stimulable phosphor sheet during exposure to radiation is so high that the image signal detected from the stimulable phosphor sheet becomes clipped.

Another object of the present invention is to provide a noise erasing method for a stimulable phosphor sheet wherein the energy remaining on a stimulable phosphor sheet is released reliably with the minimum necessary amount of erasing light, and noise is reliably prevented from occurring in the image signal detected from the stimulable phosphor sheet when the stimulable phosphor sheet is reused to record a radiation image.

The present invention provides a noise erasing method for a stimulable phosphor sheet wherein, after a stimulable phosphor sheet which has a radiation image stored thereon is exposed to stimulating rays causing the stimulable phosphor sheet to emit light, the amount of emitted light being proportional to the amount of energy stored thereon during exposure to radiation, the emitted light is photoelectrically detected in order to obtain an image signal representing the radiation image, and then the stimulable phosphor sheet is exposed to erasing light in order to release the energy remaining thereon, the noise erasing method comprising the steps of, in case where the levels of components of said image signal, (the components being obtained from the photoelectric detection of light emitted by part of said stimulable phosphor sheet) exceed a range of image signal levels from which the following information about the radiation image is detected accurately:

(i) prediction of the levels of energy stored at said part of said stimulable phosphor sheet during exposure to radiation from how the levels of the other components of said image signal, which levels fall within said range of image signal levels, are distributed, and (ii) determination of the amount of said erasing light, which is to be irradiated to said stimulable phosphor sheet, on the basis of the predicted levels of energy stored at said part of said stimulable phosphor sheet.

In cases where the levels of components of an image signal (the components being obtained from photoelectric detection of light emitted by part of a stimulable phosphor sheet) exceed a range of image signal levels from which information about the radiation image is detected accurately, the components of the image signal are clipped. Therefore, the amounts of light emitted by said part of the stimulable phosphor sheet, the amounts being represented by said image components of the image signal, (i.e. the levels of energy stored at said part of the stimulable phosphor sheet during exposure to radiation) cannot be detected from the clipped components of the image signal. However, in cases where image signal components, which correspond to several picture elements located in the vicinity of the picture elements which in turn correspond to the clipped image signal components, have levels falling within the range of image signal levels, from which information about a radiation image is detected accurately and accurately represent the image information, the levels of energy stored at said part of the stimulable phosphor sheet during exposure to radiation can be predicted from the image information which the image signal components corresponding to said several picture elements represent.

FIGS. 3A and 3B are explanatory views showing how the levels of energy stored on part of a stimulable phosphor sheet during exposure to radiation are predicted in the noise erasing method for a stimulable phosphor sheet in accordance with the present invention. Specifically, as shown in FIG. 3A, an array of picture elements P1, P2, ..., Pn located along a single scanning line is considered. The picture element array P1 through Pn includes several picture elements corresponding to clipped image signal components in a hatched region C. The image signal components corresponding to the picture elements located on the side outward from the picture elements corresponding to clipped image signal components are distributed in the form indicated by the solid lines in FIG. 3B. In such cases, it is possible to predict with a certain extent of accuracy that if the clipped image signal components were not clipped their values would be distributed as indicated by the broken line in FIG. 3B. The values of the image signal components predicted in this manner correspond to the levels of energy stored at the corresponding part of the stimulable phosphor sheet during exposure to radiation. Therefore, the levels of energy remaining on part of the stimulable phosphor sheet, the part corresponding to the picture elements which in turn correspond to the clipped image signal components, can be predicted from the predicted values of the image signal components after the radiation image is read out from the stimulable phosphor sheet.

With the noise erasing method for a stimulable phosphor sheet in accordance with the present invention, when the levels of components of an image signal, (the components being obtained from photoelectric detection of light emitted by part of a stimulable phosphor sheet) exceed a range of image signal levels from which information about the radiation image is detected accurately, the levels of energy stored on said part of the stimulable phosphor sheet during exposure to radiation are predicted from how the levels of the other components of the image signal, which levels fall within said range of image signal levels, are distributed. The amount of erasing light which is to be irradiated to the stimulable phosphor sheet is determined on the basis of the predicted levels of energy stored at said part of the stimulable phosphor sheet. Therefore, even when a stimulable phosphor sheet has been exposed to a markedly large amount of radiation during the recording of a radiation image, the energy remaining on the stimulable phosphor sheet after the radiation image read out therefrom can be released reliably with a minimum necessary amount of erasing light, and noise can be reliably prevented from occurring in an image signal detected from the stimulable phosphor sheet when the stimulable phosphor sheet is reused to record a radiation image.

DESCRIPTION OF THE PREFERRED EMBODIMENTS

The present invention will hereinbelow be described in further detail with reference to the accompanying drawings.

Figure 1:
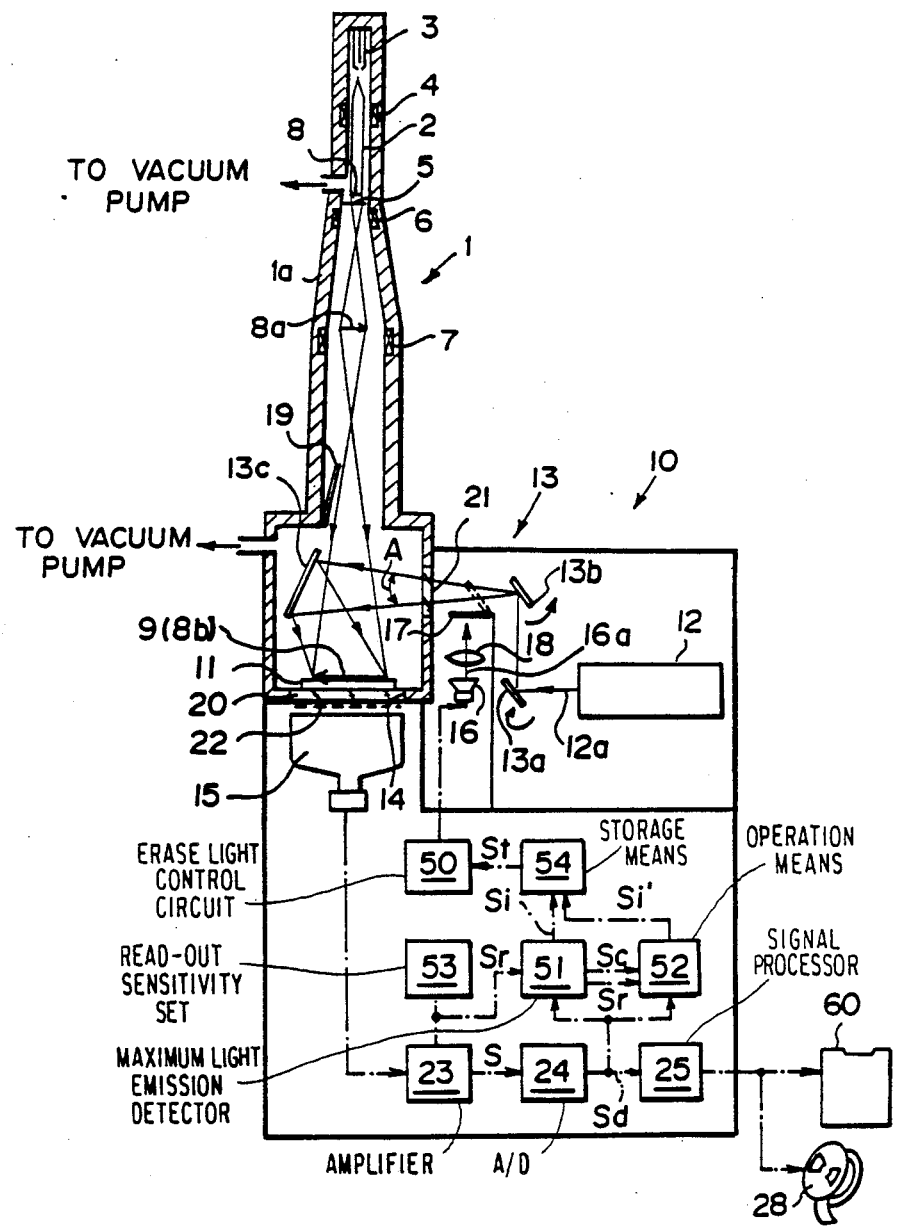
FIG. 1 is a schematic view showing an example of an electron microscope image recording and reproducing system wherein an embodiment of the noise erasing method for a stimulable phosphor sheet in accordance with the present invention is employed.

With reference to FIG. 1, a microscope body 1a of an electron microscope 1 is provided with an electron gun 3 for emitting an electron beam 2 at a uniform speed, at least one converging lens 4 for converging the electron beam 2 onto a sample plane, a sample supporting base 5 an objective lens 6 of the same type as the converging lens 4, and a projection lens 7. The electron beam 2 passing through a sample 8 disposed on the sample supporting base 5 is refracted by the objective lens 6 to form an enlarged scattering image 8a of the sample 8. The enlarged scattering image 8a is projected by the projection lens 7, and an image 8b forms at a plane of image formation 9.

An electron microscope image recording and read-out apparatus 10 is disposed under the microscope body 1a. The electron microscope image recording and read-out apparatus 10 is provided with a stimulable phosphor sheet 11 which serves as a two-dimensional sensor and which is secured at the plane of image formation 9 in the microscope body 1a, a stimulation means composed of a stimulating ray source 12 and an optical scanning system 13, a photomultiplier 15 facing the stimulable phosphor sheet 11 via a light-permeable window 14 formed in a peripheral wall of the microscope body 1a, and an erasing light source 16.

The stimulable phosphor sheet 11 comprises a transparent supporting material and a stimulable phosphor overlaid on the transparent supporting material. By way of example, the stimulating ray source 12 is constituted of an He-Ne laser or a semiconductor laser, and the optical scanning system 13 comprises a first light deflector 13a, a second light deflector 13b, and a fixed mirror 13c. As the first light deflector 13a and the second light deflector 13b, known light deflectors such as galvanometer mirrors, polygon mirrors, hologram scanners or acousto-optic deflectors (AOD's) may be used. A stimulating ray beam 12a emitted by the stimulating ray source 12 is deflected by the first light deflector 13a, and is then deflected by the second light deflector 13b in the direction indicated by the arrow A, normal to the direction of the first optical deflection. The stimulating ray beam 12a is then passed through a light-permeable window 21 formed of lead glass or the like into the microscope body 1a, and is reflected by the fixed mirror 13c toward the stimulable phosphor sheet 11. In this manner, the stimulable phosphor sheet 11 is scanned by the stimulating ray beam 12a in the X and Y directions. Though not shown, the stimulating ray beam 12a emitted by the stimulating ray source 12 should preferably be passed through a filter for cutting off light having a wavelength within the wavelength range of the light emitted by the stimulable phosphor sheet 11, as will be described later, and then passed through a beam expander for adjusting the beam diameter of the stimulating ray beam 12a. The stimulating ray beam 12a should then be deflected by the first light deflector 13a and the second light deflector 13b, passed through an fθ lens, and made to impinge upon the stimulable phosphor sheet 11 as a beam having a uniform beam diameter.

The erasing light source 16 generates light having a wavelength within the stimulation wavelength range of the stimulable phosphor sheet 11. A mirror 17, which may be moved into and out of the optical path of the stimulating ray beam 12a, is disposed between the second light deflector 13b and the fixed mirror 13c. Erasing light 16a emitted by the erasing light source 16 is condensed by a lens 18. When the mirror 17 is in the optical path of the stimulating ray beam 12a, the erasing light 16a is reflected by the mirror 17 and the fixed mirror 13c, and is irradiated to the overall surface of the stimulable phosphor sheet 11. Also, a shutter 19 for intercepting the electron beam 2 is disposed in the microscope body 1a between the objective lens 6 and the stimulable phosphor sheet 11, and an optical shutter 22 is disposed between the stimulable phosphor sheet 11 and the photomultiplier 15. A glass plate 20 provided with an optical filter for transmitting only the light emitted by the stimulable phosphor sheet 11 and filtering out the stimulating ray beam 12a is fitted to the light-permeable window 14. As in the ordinary type of electron microscope, during the course of operation, the inside of the microscope body 1a, including the section where the stimulable phosphor sheet 11 is disposed, is maintained in a vacuum by a known means such as a vacuum pump.

How an electron microscope image is recorded and read out with the electron microscope image recording and read-out apparatus 10 having the configuration described above, will hereinbelow be described in detail. After the sample 8 is placed on the sample supporting base 5, the electron gun 3, the converging lens 4, the objective lens 6 and the projection lens 7 are operated, and the shutter 19 is opened as shown in FIG. 1. As a result, energy from the electron beam 2 carrying the enlarged image of the sample 8 is stored on the stimulable phosphor sheet 11 secured at the plane of image formation 9. In the course of exposure to the electron beam 2, the optical shutter 22 should preferably be closed. Then, the shutter 19 is closed, the optical shutter 22 is opened, and the stimulating ray beam 12a emitted by the stimulating ray source 12 and deflected in the X and Y directions is made to impinge upon the stimulable phosphor sheet 11. The stimulable phosphor sheet 11 is two-dimensionally scanned by the thus deflected stimulating ray beam 12a, and is caused to release light with an intensity proportional to the level of the stored electron beam energy. The light emitted by the stimulable phosphor sheet 11 is received by the photomultiplier 15 via the glass plate 20 provided with the optical filter for filtering out the stimulating ray beam 12a, and the amount of the light emitted is detected photoelectrically by the photomultiplier 15.

The output of the photomultiplier 15 representing the amount of light emitted by the stimulable phosphor sheet 11, the amount proportional to the amount of energy stored on the stimulable phosphor sheet 11 during exposure to the electron beam 2, is amplified by the amplifier 23 to generate an electric signal S (a read-out image signal) of appropriate levels. Thereafter, the read-out image signal S is converted by an A/D converter 24 into a digital image signal Sd, which is then subjected to image processing such as gradation processing or frequency response enhancement processing in the signal processing circuit 25 and sent to an image reproducing apparatus 60.

Figure 2:
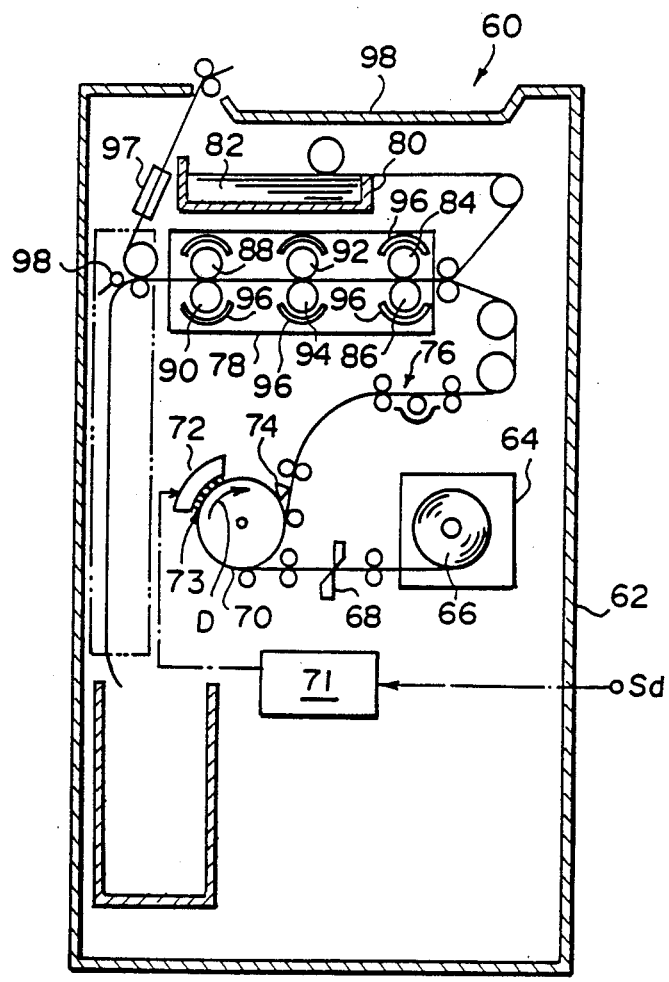
FIG. 2 is a schematic side view showing the image reproducing apparatus utilized in the electron microscope image recording and reproducing system shown in FIG. 1, and FIGS. 3A and 3B are explanatory views showing how the levels of energy stored on part of a stimulable phosphor sheet during exposure to radiation are predicted in the embodiment of the noise erasing method for a stimulable phosphor sheet in accordance with the present invention.

Reproduction of the electron microscope image will hereinbelow be described with reference to FIG. 2 showing the image reproducing apparatus 60 in detail. A rolled heat development photosensitive material 66 is accommodated as a recording material in a magazine 64 fed into an apparatus body 62 of the image reproducing apparatus 60. The heat development photosensitive material 66 is pulled out from the outer circumference of the roll, cut into a predetermined length by a cutter 68, and thereafter wound up around the outer circumference of a rotatable recording drum 70. An exposure head 72 which acts as an image recording head is provided along the outer circumference of the rotatable drum 70. The exposure head 72 is provided with light emitting devices 73 for producing three-color light beams. The light emitting devices 73 are controlled in accordance with the image signal Sd by a modulation circuit 71, which receives the image signal Sd from the aforesaid signal processing circuit 25. In this manner, the light beams produced by the light emitting devices 73 are modulated. The rotatable drum 70 is rotated in the direction indicated by the arrow D, and at the same time the exposure head 72 is moved along the surface of the rotatable drum 70 in its longitudinal direction. Accordingly, main scanning and sub-scanning by the light beams are achieved, and the light beams are two-dimensionally irradiated onto the heat development photosensitive material 66. As the light beams are modulated in accordance with the image signal Sd, the image which the image signal Sd represents, i.e. the electron microscope image of the sample 8 stored on the stimulable phosphor sheet 11, is recorded as a photographic latent image on the heat development photosensitive material 66 irradiated by the light beams.

The direction of rotation of the rotatable drum 70 is reversed, and the heat development photosensitive material 66 which has been exposed to the light beams is separated by a scraper 74 from the rotatable drum 70. Thereafter, water, which serves as the medium for image formation, is applied to the heat development photosensitive material 66 at a water applying section 76, and the heat development photosensitive material 66 is sent to a heat development and transfer section 78 having an internal heating means.

A plurality of image receiving materials 82, 82, ... are housed in a tray 80, and the image receiving material 82 at the top of the stack in the tray 80 is sent to the heat development and transfer section 78.

In the heat development and transfer section 78, conveying rollers 84 and 86 in close contact with each other are provided at an inlet to make the heat development photosensitive material 66 and the image receiving material 82 come into close contact with each other. The heat development photosensitive material 66 and the image receiving material 82 are then sent to conveying rollers 88 and 90 provided at an outlet of the heat development and transfer section 78. Conveying rollers 92 and 94 are provided at approximately the middle of the heat development and transfer section 78, and send the heat development photosensitive material 66 and the image receiving material 82, fed from the conveying rollers 84 and 86 and kept in close contact with each other, to the conveying rollers 88 and 90. The respective conveying rollers are operated by motors (not shown), and are heated to predetermined temperatures by heaters 96, 96, ... (using electric heating elements) provided on the sides opposite to the sides facing the conveyance path of the heat development photosensitive material 66 and the image receiving material 82 with respect to the conveying rollers. As the heat development photosensitive material 66 contacts the heated conveying rollers, the photographic latent image on the heat development photosensitive material 66 is heat-developed, and the developed image is transferred from the heat development photosensitive material 66 onto the image receiving material 82.

A separation means 98 is provided downstream from the heat development and transfer section 78 for separating the heat development photosensitive material 66 and the image receiving material 82 from each other after they exit the heat development and transfer section 78, sending the heat development photosensitive material 66 into a waste photosensitive material accommodating box 96, and sending the image receiving material 82 into a dryer 97. The image receiving material 82, onto which the electron microscope image has been transferred in the manner as mentioned above, is dried by the dryer 97, and sent onto a tray 98 provided on the top of the apparatus body 62.

In the manner described above, the electron microscope image of the sample 8 is ultimately recorded on the image receiving material 82. When the image signal Sd is processed for color formation in the signal processing circuit 25, the electron microscope image can be displayed as a color image.

As described above, the image signal generated by the signal processing circuit 25 may be directly sent to the image reproducing apparatus 60 and used for the reproduction of the electron microscope image. Alternatively, the image signal may be stored on a storage medium 28 constituted of a magnetic tape, a magnetic disk or the like, and may later be used for the reproduction of the electron microscope image.

After the detection of the light emitted by the stimulable phosphor sheet 11, i.e. the read-out of the electron microscope image, is finished in the manner described above, the optical shutter 22 is closed, the mirror 17 is moved into the optical path of the stimulating ray beam 12a, and the erasing light source 16 is turned on in synchronization with the movement of the mirror 17. As a result, the surface of the stimulable phosphor sheet 11 is exposed to the erasing light 16a emitted by the erasing light source 16. Even when the stimulable phosphor sheet 11 is exposed to the stimulating ray beam 12a in the manner described above, the energy which was stored on the stimulable phosphor sheet 11 during exposure to the electron beam 2 is not completely released from the sheet 11, and part of the stored energy may often remain stored on the sheet 11. However, when the erasing light 16a is irradiated to the stimulable phosphor sheet 11 as described above, the residual energy on the sheet 11 is erased, and the sheet 11 becomes reusable for image recording. Noise components caused by radioactive isotopes such as Ra226, contained as impurities in the stimulable phosphor of the stimulable phosphor sheet 11, are also released upon exposure to the erasing light 16a. The erasing light source 16 may be constituted of a tungsten-filament lamp, a halogen lamp, an infrared lamp, a xenon flash lamp, a laser beam source or the like as disclosed in, for example, U.S. Pat. No. 4,400,619. Also, the stimulating ray source 12 used for image read-out may also be utilized for the erasing.

An image for field finding and focusing can be output to the image reproducing apparatus 60 in the same manner as that described above, and the displayed image may be used to carry out field finding and focusing. Alternatively, a monitor image may be displayed on a display device such as a CRT, and a displayed monitor image may be used to carry out the field finding and focusing.

How the amount of the erasing light 16a irradiated to the stimulable phosphor sheet 11 is controlled will be described hereinbelow. The erasing light source 16 produces the erasing light 16a having a constant illuminance. The time the erasing light source 16 is turned on is controlled by a light source operation control circuit 50. In order to control the time the erasing light source 16 is turned on, the digital readout image signal Sd is fed into the maximum light emission amount detecting means 51 and the operation means 52. The maximum light emission amount detecting means 51 determines the maximum value Io, which falls within the range of image signal values which are not clipped, from the digital read-out image signal Sd which represents a single radiation image. Also, the maximum light emission amount detecting means 51 receives a signal Sr representing the read-out sensitivity, which is set by a read-out sensitivity setting means 53, and calculates the absolute maximum light emission amount I (i.e. the absolute maximum amount of light emitted by the stimulable phosphor sheet 11) from the maximum value Io and the read-out sensitivity which is represented by the signal Sr. The read-out sensitivity setting means 53 sets the conditions which define the read-out sensitivity, such as the gain of the amplifier 23 and the intensity of the stimulating ray beam 12a, on the basis of, for example, the amount of the electron beam 2 which was irradiated to the stimulable phosphor sheet 11 during the recording of the electron microscope image.

A signal Si which represents the absolute maximum light emission amount I is fed into a storage means 54. When the absolute maximum light emission amount I is large, the level of energy remaining on the stimulable phosphor sheet 11 is also high. As the level of energy remaining on the stimulable phosphor sheet 11 becomes higher, a larger amount of the erasing light 16a is required in order to release the remaining energy nearly completely, i.e. so that no noise is generated in the image signal detected from the stimulable phosphor sheet 11 when it is reused to record a radiation image. (The amount of the erasing light 16a is calculated from the formula of illuminance × time for which the erasing light source 16 is turned on). The storage means 54 has a ROM or the like, storing the time t for which the erasing light source 16 is to be turned on, and which is suitable for different absolute maximum light emission amounts I. (The stored time t is the minimum value required in order to release nearly completely the energy remaining on the stimulable phosphor sheet 11). The storage means 54 reads the necessary time t corresponding to the absolute maximum light emission amount I, which is represented by the signal Si received from the maximum light emission amount detecting means 51. The storage means 54 then feeds a signal St, which represents the necessary time t, to a light source operation control circuit 50. The light source operation control circuit 50 turns on the erasing light source 16 for the necessary time t represented by the signal St. In this manner, the time for which the erasing light source 16 is turned on (i.e. the amount of the erasing light 16a irradiated to the stimulable phosphor sheet 11) is set to the minimum value required for the stimulable phosphor sheet 11. By way of example, the maximum light emission amount detecting means 51, the operation means 52, and the storage means 54 are constituted of a microcomputer system.

Figure 3A:
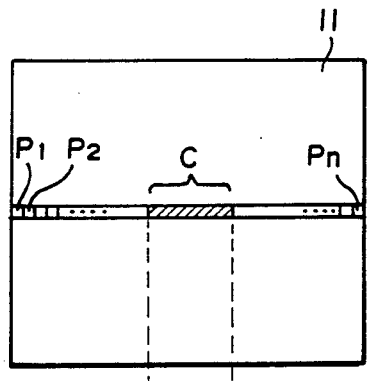
Figure 3B:
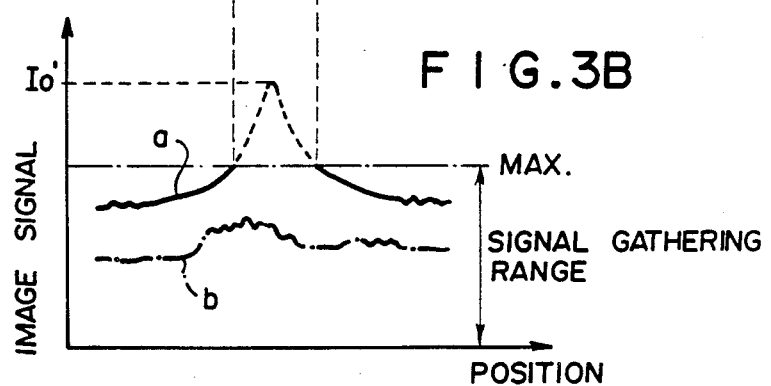

The amount of the erasing light 16a irradiated to the stimulable phosphor sheet 11 is controlled in the manner described above when the levels of the digital read-out image signal Sd fall within the range of image signal values which are not clipped, i.e. when the levels of the digital read-out image signal Sd are distributed as indicated by the chained line b in FIG. 3B. In cases where the digital read-out image signal Sd is in the maximum of the range over which image signals can be gathered by the A/D converter 24 (i.e. in cases where the intensity of the light emitted by part of the stimulable phosphor sheet 11 is markedly high and corresponding components of the image signal S detected from the stimulable phosphor sheet 1 are clipped) the maximum light emission amount detecting means 51 feeds a signal Sc, representing the picture element array including the picture elements corresponding to the clipped image signal components, to the operation means 52. The operation means 52 determines the distribution of the image signal components of the digital read-out image signal Sd corresponding to the picture element array represented by the signal Sc, whose image signal components are not clipped. (In this example, these image signal components are distributed as indicated by the solid line a in FIG. 3B). Based on how these image signal components are distributed, the operation means 52 predicts what level of maximum value Io' the clipped image signal components would take if they were not clipped. In order to predict the maximum value Io', the distribution of the image signal components indicated by the solid line a in FIG. 3B is approximated by, for example, a function $y=e(x^2-a)$ or $y=bx$, and a calculation is made to find what value the approximate function takes, at the position corresponding to the middle point of the region C, in which the picture elements corresponding to the clipped image signal components are located. The operation means 52 receives the signal Sc and the signal Sr which represents the read-out sensitivity. Based on the predicted maximum value Io' and the read-out sensitivity which is represented by the signal Sr, the operation means 52 calculates the absolute maximum light emission amount I' which corresponds to the predicted maximum value Io'. The operation means 52 calculates absolute maximum light emission amounts I' along the other picture element arrays including picture elements corresponding to the clipped image signal components. (In general, only a single such picture element array being present does not occur). Thereafter, the operation means 52 feeds a signal Si', which represents the largest value of the absolute maximum light emission amounts I', to the storage means 54. In the storage means 54, in the same manner as when the signal Si was received from the maximum light emission amount detecting means 51, the necessary time t, for which the erasing light source 16 is to be turned on, is found based on the signal Si' and read from the ROM or the like. A signal St representing the necessary time t is fed into the light source operation control circuit 50. The light source operation control circuit 50 turns on the erasing light source 16 for the necessary time t represented by the signal St. In this manner, the time for which the erasing light source 16 is turned on (i.e. the amount of the erasing light 16a irradiated to the stimulable phosphor sheet 11) is set to the minimum value required for nearly completely releasing the energy remaining on the stimulable phosphor sheet 11.

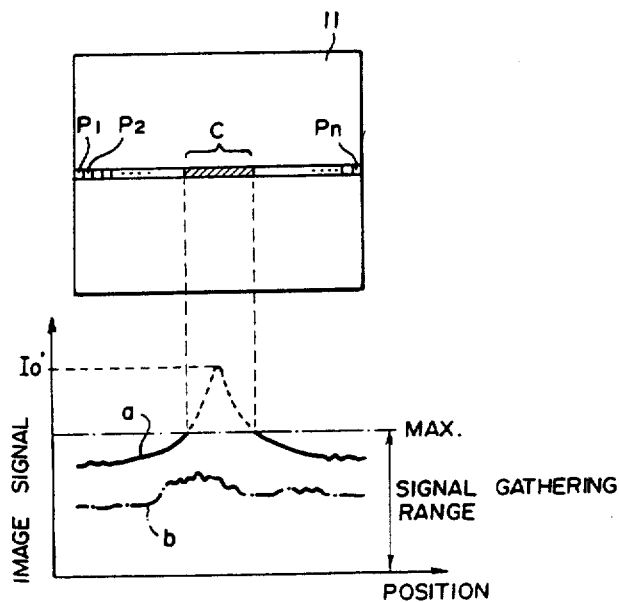

I claim:

1. A noise erasing method for a stimulable phosphor sheet wherein, after a stimulable phosphor sheet which has a radiation image stored thereon is exposed to stimulating rays causing the stimulable phosphor sheet to emit light, the amount of which emitted light being proportional to the amount of energy stored thereon during exposure to radiation, the emitted light is photoelectrically detected in order to obtain an image signal representing the radiation image, and then the stimulable phosphor sheet is exposed to erasing light in order to release the energy remaining thereon, the noise erasing method comprising the steps of, in cases where the levels of components of said image signal (the components being obtained from the photoelectric detection of light emitted by part of said stimulable phosphor sheet) exceed a range of image signal levels from which the following information about the radiation image is detected accurately:

(i) prediction of the levels of energy stored at said part of said stimulable phosphor sheet during exposure to radiation from how the levels of the other components of said image signal, which levels fall within said range of image signal levels, are distributed, and (ii) determination of the amount of said erasing light, which is to be irradiated to said stimulable phosphor sheet, on the basis of the predicted levels of energy stored at said part of said stimulable phosphor sheet.

2. A method as defined in claim 1, wherein the maximum of the levels of energy stored at said part of said stimulable phosphor sheet during exposure to radiation is predicted from how the levels of the other components of said image signal, which levels fall within said range of image signal levels, are distributed, and the amount of said erasing light, which is to be irradiated to said stimulable phosphor sheet, is determined on the basis of the predicted maximum level of energy stored at said part of said stimulable phosphor sheet.

3. A method as defined in claim 2, wherein the maximum of the levels of energy stored at said part of said stimulable phosphor sheet during exposure to radiation is predicted from an operation wherein the distribution of the levels of the other components of said image signal, which levels fall within said range of image signal levels, is approximated by an appropriate function, and a calculation is made to find what value the function takes at the position corresponding to the middle point of said part of said stimulable phosphor sheet.

4. A method as defined in claim 1 wherein said radiation image is an electron microscope image.

* * * * *

UNITED STATES PATENT AND TRADEMARK OFFICE
CERTIFICATE OF CORRECTION

PATENT NO. : 4,952,806

DATED : August 28, 1990

INVENTOR(S) : Nobufumi MORI

It is certified that error appears in the above-identified patent and that said Letters Patent is hereby corrected as shown below:

TITLE PAGE:

Delete present drawing illustration at bottom of title page and replace with correct drawing as shown on the attached page.
(This will apply to the Grant only.)

Signed and Sealed this

Third Day of March, 1992

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,952,806

DATED : August 28, 1990

INVENTOR(S) : Nobufumi MORI

It is certified that error appears in the above-identified patent and that said Letters Patent is hereby corrected as shown below: